United States Patent
Liu

(10) Patent No.: US 7,644,340 B1
(45) Date of Patent: Jan. 5, 2010

(54) GENERAL CONVOLUTIONAL INTERLEAVER AND DEINTERLEAVER

(75) Inventor: Peter Tze-Hwa Liu, Alameda, CA (US)

(73) Assignee: Marvell International Ltd., Hamilton (BM)

( * ) Notice: Subject to any disclaimer, the term of this patent is extended or adjusted under 35 U.S.C. 154(b) by 694 days.

(21) Appl. No.: 11/361,930

(22) Filed: Feb. 24, 2006

Related U.S. Application Data

(60) Provisional application No. 60/727,659, filed on Oct. 18, 2005, provisional application No. 60/698,881, filed on Jul. 13, 2005, provisional application No. 60/698,226, filed on Jul. 11, 2005, provisional application No. 60/697,666, filed on Jul. 8, 2005.

(51) Int. Cl.
*H03M 13/00* (2006.01)

(52) U.S. Cl. .................. 714/762; 714/786; 714/788; 714/701; 714/755; 711/157; 711/209; 711/218; 375/262

(58) Field of Classification Search ............... 714/701, 714/708, 752, 755, 762, 786, 788, 789; 711/157, 711/209, 218; 375/262
See application file for complete search history.

(56) References Cited

U.S. PATENT DOCUMENTS

| | | | |
|---|---|---|---|
| 5,537,420 A * | 7/1996 | Huang | 714/701 |
| 5,592,492 A | 1/1997 | Ben-Efraim et al. | |
| 5,745,497 A | 4/1998 | Ben-Efraim et al. | |
| 5,764,649 A | 6/1998 | Tong | |
| 2004/0117713 A1 * | 6/2004 | Cameron | 714/755 |
| 2006/0107170 A1 * | 5/2006 | Deczky | 714/752 |
| 2006/0153311 A1 * | 7/2006 | Xue et al. | 375/262 |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

(Continued)

*Primary Examiner*—Guy J Lamarre

(57) ABSTRACT

A circuit is provided for performing interleaving and deinterleaving functions in a digital communication system. The circuit includes a single-port memory that reads first data units from a first interleaved sequence of address locations to generate a first data stream and that writes second data units from a second data stream to the address locations. A first address generator module communicates with the single-port memory and generates a first interleaved sequence of addresses that correspond to the address locations and correspond to one of an interleaving function and deinterleaving function between the first data stream and the second data stream.

34 Claims, 16 Drawing Sheets

OTHER PUBLICATIONS

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11h—2003 (Amendment to IEEE Std 802.11, 1999 Edition (Reaff 2003)); as amended by IEEE Stds 802.11a-1999, 802.11b-1999, 802.11b-1999/Cor 1- 2001, 802.11d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

802.11n; IEEE P802.11-04/0889r6; Wireless LANs, TGn Sync Proposal Technical Specification; 131 pages.

IEEE Std 802.16/2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

ITU-T Recommendation G.993.2, Very high speed digital subscriber line 2. Study Group 15, 225 pages.

"Error Protection Consideration for Spaceflight Data Storage Technology" and "Proceeding of Symposium on Space Flight Data Storage Technology" Partial presentation of an Invited Paper by Dr. Tze-Hwa Liu, Published by JPL D-6049, vol. 2, NASA/JPL, Pasadena, CA, Jul. 21, 1998.

ITU-T, G.993.1, "Very high speed digital subscriber line foundation" Series G: Transmission Systems and Media, Digital Systems and Networks, ITU-T Study Group 15 (2001-2004).

ITU-T, G992.3, Digital section and digital line system-Access networks; Series G: Transmissions Systems and Media, Digital Systems and Networks, Asymmetric digital subscriber line transceivers (ADSL2); ITU-T Study Group; 301 pages. (Jul. 2002).

Network and Customer Installation Interfaces-Asymmetric Digital Subscriber Line (ADSL)Metallic Interface; American National Standards Institute, NY, NY; 246 pages; (Nov. 1998).

* cited by examiner

GENERAL CONVOLUTIONAL INTERLEAVER AND DEINTERLEAVER

CROSS-REFERENCE TO RELATED APPLICATIONS

This application claims the benefit of U.S. Provisional Applications No. 60/727,659, filed on Oct. 18, 2005, 60/698,881, filed on Jul. 13, 2005, No. 60/698,226, filed on Jul. 11, 2005, and No. 60/697,666, filed on Jul. 8, 2005. The disclosures of the above applications are incorporated herein by reference in their entirety.

FIELD OF THE INVENTION

The present invention relates to methods for general convolutional interleaving a sequence of digital data for transmission over a communication channel.

BACKGROUND OF THE INVENTION

Interleaving is a method of sequentially separating a data block into units, such as bytes, and then transmitting the units out of sequence in a deterministic manner. A receiver uses an inverse of the interleaving method to reorder the received bytes and reproduce the data block. Digital communication systems that communicate over channels subject to bursty noise can employ interleaving in combination with error correction to reduce data error rates through the channel. Communicating the units out of sequence reduces the probability that a noise burst will corrupt sequential data units in the data block. Interleaving thereby increases the probability that the error correcting code will be able to recover data that was corrupted in the channel.

Referring now to FIG. 1, a block diagram is shown of an interleaving communication system 10 according to the prior art. An encoder 12 receives the data block 14 and encodes it with the error correcting code. An interleaver 16 receives the encoded data block and performs the interleaving operation to reorder bytes of the data block in a deterministic manner. Interleaver 16 then communicates the interleaved bytes to a transmitter 18 for transmission through channel 20.

Bursty noise may exist on channel 20 that corrupts some of the interleaved bytes as they propagate to a receiver 22. A deinterleaver 24 receives the corrupted and interleaved bytes from receiver 22 and deinterleaves them according to an inverse of the interleaving method employed by interleaver 16. A decoder 26 receives the deinterleaved bytes and performs an error correction operation to recover data from the corrupted bytes and reproduce the data block at output 28. Whether decoder 26 succeeds in recovering the data is based on the type of error correcting code being used, the duration and frequency of the bursty noise in channel 20, and the interleaving depth, which is described below.

There are many types of interleaving schemes that have been proposed and implemented in modern digital communication systems. One popular scheme is block interleaving (BI) and is used in systems such as wireless LAN (WLAN). Referring now to FIG. 2A, operation of interleaver 16 and deinterleaver 24 will be described as they implement the BI scheme. Bytes b0 . . . b11 of an example encoded data block 30 are shown. Interleaver 16 and deinterleaver 24 include respective ping-pong memories that are conceptually partitioned into N rows and D columns, where D and N can be any positive integers. D represents the interleaving depth and N represents an interleaving block.

The memory space of interleaver 16 is shown as matrices 32-1 and 32-2 having D=2 columns and N=3 rows. Interleaver 16 writes bytes (b0 . . . b5) from data block 30 to matrix 32-1 in column-by-column fashion until matrix 32-1 is full. After matrix 32-1 is full, interleaver 16 writes bytes (b6 . . . b1) from data block 30 to matrix 32-2 in column-by-column fashion. While interleaver 16 is writing bytes (b6 . . . b11) into matrix 32-2, interleaver 16 also reads bytes (b0 . . . b5) out from matrix 32-1 in row-by-row fashion to be transmitted in the order shown at 34. After data bytes (b6 . . . b11) have been written into matrix 32-2 and data bytes (b0 . . . b5) have been read from matrix 32-1, interleaver 16 starts writing data into matrix 32-1 column-by-column and reading data out from 32-2 row-by-row. Interleaver 16 repeats the writing and reading processes via respective ones of the matrices 32 until the entire data block 30 has been interleaved. These processes are repeated every N*D period.

The deinterleaver memory is shown as matrices 36-1 and 36-2 that have the same dimension as matrices 32. Deinterleaver 24 writes received bytes 34 into matrix 36-1 row-by-row (e.g., (b0,b3), (b1,b4), (b2,b5)) until matrix 36-1 is full. After matrix 36-1 is full, deinterleaver 24 writes bytes (b6 . . . b11) into matrix 36-2 row-by-row and reads data (b0 . . . b5) out from matrix 36-1 column-by-column. Deinterleaver 24 repeats the writing and reading processes via respective ones of the ping-pong RAMs until all of the bytes at 34 have been processed. These processes are repeated every (N*D) period. The bytes read from deinterleaver 24 form a reconstructed data block 38 that has the same byte order as data block 30.

BI is straightforward to implement, however the ping-pong memory size is 2*N*D bytes in interleaver 16 and in deinterleaver 24. This requirement causes the ping-pong memories to become undesirably large and expensive as the interleaving depth D increases.

The International Telecommunication Union (ITU) has published specifications 992.1, 992.3, and 993.1, which are hereby incorporated by reference in their entirety, that outline a new interleaving scheme named general convolutional interleaving (GCI). GCI is being used for interleaving over asynchronous digital subscriber line (ADSL) and very high bit-rate digital subscriber line (VDSL1) telephone networks. GCI can also be used for interleaving over wireless communication channels.

Referring now to FIG. 2B, operation of interleaver 16 and deinterleaver 24 will be described as they implement the GCI scheme. GCI delays every byte of the N repetitive data blocks by a fixed pattern. It delays the first byte of every N-byte sequence by 0 bytes, the $2^{nd}$ byte of every N-byte sequence by (D−1) bytes, the $3^{rd}$ byte of every N-byte sequence by 2*(D−1) bytes and so forth. The example of FIG. 2B uses N=3 and D=2.

Encoder 12 passes the encoded data bytes 30 to interleaver 16. Interleaver 16 delays the first bytes (b0, b3, b6, b9) by 0 bytes, delays the $2^{nd}$ bytes (b1,b4,b7,b10) by one (D−1) byte, and delays the $3^{rd}$ bytes (b2, b5, b8, b11) by two (2*(D−1)) bytes. The interleaved data bytes 34 are transmitted over channel 20. Deinterleaver 24 finds the N (3) byte boundary and then delays the $1^{st}$ bytes (b0, b3, b6, b9) by two bytes, i.e., (2*(D−1)) bytes, delays the $2^{nd}$ bytes (b1, b4, b7) by one byte, i.e., (D−1) byte, and delays the $3^{rd}$ bytes (b2, b5, b8, b11) by 0 bytes. The de-interleaved data 38 is then presented to decoder 26 for further processing.

Unlike BI, GCI repeats every N byte period, not every (N*D) byte period. Also, GCI requires that N and D are relatively prime.

SUMMARY OF THE INVENTION

A circuit is provided for performing interleaving and deinterleaving functions in a digital communication system. The circuit includes a single-port memory that reads first data units from a first interleaved sequence of address locations to generate a first data stream and that writes second data units from a second data stream to the address locations. A first address generator module communicates with the single-port memory and generates a first interleaved sequence of addresses that correspond to the address locations and correspond to one of an interleaving function and deinterleaving function between the first data stream and the second data stream.

In other features the single-port memory performs each read immediately prior to performing each write for each of the address locations. Each read and write are associated with the same address location. The interleaving function includes a triangular convolutional interleaving (TCI) function.

In other features a dual-port memory communicates with the single-port memory. A second address generator module communicates with the dual-port memory, generates a second set of address locations corresponding to addresses of a first one of the dual ports, and generates a third set of address locations corresponding to addresses of the second one of the dual ports, wherein the corresponding orders of the second and third sets of address locations correspond to one of the interleaving function and deinterleaving function between the first data stream and the second data stream. The dual-port memory receives the first data stream via the first one of the dual ports, sequentially writes the first data units to corresponding memory locations according to the order of the second set of address locations, and sequentially reads the first set of data units from their corresponding memory locations according to the order of the third set of address locations.

In other features the dual-port memory receives a third data stream via the first one of the dual ports, sequentially writes third data units of the third data stream to corresponding memory locations according to the order of the second set of address locations, and generates the second data stream by sequentially reading the third set of data units from their corresponding memory locations according to the order of the third set of address locations.

In other features the circuit includes a synchronization signal communicating between the first address generator module and the second address generator module. The dual-port memory has less memory space than the single-port memory. The single-port memory includes independent blocks of the address locations, wherein each block corresponds with an independent one of interleaving functions and deinterleaving functions between corresponding pairs of a plurality of first data streams and second data streams. The blocks are of equal size. A resource allocation table module generates an address corresponding to a selected one of the blocks based on a selected one of the corresponding pairs of first data streams and second data streams, and a plurality of first address generator modules associated with corresponding ones of the blocks. A selected one of the plurality of first address generator modules addresses the address locations within the selected block. The resource allocation module dynamically determines a size of each block based on an interleaving depth associated with each block.

In other features a communication circuit includes the circuit and communicates with one of a modulator and a demodulator. The communication circuit includes one of a line driver and a line receiver that communicates with a corresponding one of the modulator and demodulator. A very high bit-rate digital subscriber line (VDSL) communication circuit includes the circuit.

A method of performing interleaving and deinterleaving functions in a digital communication system is provided and includes reading first data units from a first interleaved sequence of address locations, generating a first data stream based on the first data units, writing second data units from a second data stream to the address locations, and generating a first interleaved sequence of addresses that correspond to the address locations and correspond to one of an interleaving function and deinterleaving function between the first data stream and the second data stream.

In other features each reading step executes immediately prior to each writing step for each of the address locations. Each reading step and writing step are associated with the same address location. The interleaving function includes a triangular convolutional interleaving (TCI) function.

In other features the method can include providing a dual-port memory that stores the data units associated with one of the reading step and the writing step. The method can include communicating with the dual-port memory, generating a second set of address locations corresponding to addresses of a first port of the dual-port memory, and generating a third set of address locations corresponding to addresses of a second port of the dual-port memory, wherein the corresponding orders of the second and third sets of address locations correspond to one of the interleaving function and deinterleaving function between the first data stream and the second data stream. The dual-port memory receives the first data stream via the first one of the dual ports and further comprising sequentially writing the first data units to corresponding memory locations according to the order of the second set of address locations, and sequentially reading the first set of data units from their corresponding memory locations according to the order of the third set of address locations. The dual-port memory receives a third data stream via the first one of the dual ports and further comprising sequentially writing third data units of the third data stream to corresponding memory locations according to the order of the second set of address locations, and generating the second data stream by sequentially reading the third set of data units from their corresponding memory locations according to the order of the third set of address locations.

In other features the method includes synchronizing generating an individual address from each of the first interleaved sequence of addresses, the second set of address locations, and the third set of address locations. The dual-port memory has less memory space than memory of the address locations. The method can include maintaining independent blocks of the address locations, wherein each block corresponds with an independent one of interleaving functions and deinterleaving functions between corresponding pairs of a plurality of first data streams and second data streams. The blocks are of equal size. The method can include generating an address corresponding to a selected one of the blocks based on a selected one of the corresponding pairs of first data streams and second data streams. The method can include dynamically determining a size of each block based on an interleaving depth associated with each block. The method can include one of a modulating step and a demodulating step. The method can include one of a transmitting step and a receiving step associated with a respective one of the modulating and demodulating steps. The method can include a very high bit-rate digital subscriber line (VDSL) communication method that includes the method.

A circuit is provided for performing interleaving and deinterleaving functions in a digital communication system and includes single-port memory means for reading first data units from a first interleaved sequence of address locations to generate a first data stream and for writing second data units from a second data stream to the address locations. The circuit also includes first address generator means for communicating with the single-port memory means and generating a first interleaved sequence of addresses that correspond to the address locations and correspond to one of an interleaving function and deinterleaving function between the first data stream and the second data stream.

In other features the single-port memory means performs each read immediately prior to performing each write for each of the address locations. Each read and write are associated with the same address location. The interleaving function includes a triangular convolutional interleaving (TCI) function.

In other features the circuit includes dual-port memory means for communicating with the single-port memory means. The circuit can include second address generator means for communicating with the dual-port memory means, generating a second set of address locations corresponding to addresses of a first one of the dual ports, and generating a third set of address locations corresponding to addresses of the second one of the dual ports, wherein the corresponding orders of the second and third sets of address locations correspond to one of the interleaving function and deinterleaving function between the first data stream and the second data stream. The dual-port memory means receives the first data stream via the first one of the dual ports, sequentially writes the first data units to corresponding memory locations according to the order of the second set of address locations, and sequentially reads the first set of data units from their corresponding memory locations according to the order of the third set of address locations. The dual-port memory means receives a third data stream via the first one of the dual ports, sequentially writes third data units of the third data stream to corresponding memory locations according to the order of the second set of address locations, and generates the second data stream by sequentially reading the third set of data units from their corresponding memory locations according to the order of the third set of address locations.

In other features the circuit includes synchronization signal means for communicating between the first address generator means and the second address generator means. The dual-port memory means has less memory space than the single-port memory means. The single-port memory means includes independent blocks of the address locations, wherein each block corresponds with an independent one of interleaving functions and deinterleaving functions between corresponding pairs of a plurality of first data streams and second data streams. The blocks are of equal size. The circuit can include resource allocation table means for generating an address corresponding to a selected one of the blocks based on a selected one of the corresponding pairs of first data streams and second data streams, and a plurality of first address generator means associated with corresponding ones of the blocks, wherein a selected one of the plurality of first address generator means addresses the address locations within the selected block. The resource allocation means dynamically determines a size of each block based on an interleaving depth associated with each block. A communication circuit can include the circuit and the circuit communicates with one of modulator means for modulating a carrier signal and demodulator means for demodulating a carrier signal. The communication circuit can include one of driver means and line receiver means for communicating with a corresponding one of the modulator means and demodulator means. A very high bit-rate digital subscriber line (VDSL) communication circuit can include the circuit.

In still other features, the systems and methods described above are implemented by a computer program executed by one or more processors. The computer program can reside on a computer readable medium such as but not limited to memory, non-volatile data storage and/or other suitable tangible storage mediums.

Also provided is a computer program that is stored on a computer-readable medium and executed by a processor and that performs interleaving and deinterleaving functions in a digital communication system. The computer program reads first data units from a first interleaved sequence of address locations, generates a first data stream based on the first data units, writes second data units from a second data stream to the address locations, and generates a first interleaved sequence of addresses that correspond to the address locations and correspond to one of an interleaving function and deinterleaving function between the first data stream and the second data stream.

In other features each reading step executes immediately prior to each writing step for each of the address locations. Each reading step and writing step are associated with the same address location. The interleaving function includes a triangular convolutional interleaving (TCI) function.

In other features the computer program can include providing a dual-port memory that stores the data units associated with one of the reading step and the writing step. The computer program can include communicating with the dual-port memory, generating a second set of address locations corresponding to addresses of a first port of the dual-port memory, and generating a third set of address locations corresponding to addresses of a second port of the dual-port memory, wherein the corresponding orders of the second and third sets of address locations correspond to one of the interleaving function and deinterleaving function between the first data stream and the second data stream. The dual-port memory receives the first data stream via the first one of the dual ports and further comprising sequentially writing the first data units to corresponding memory locations according to the order of the second set of address locations, and sequentially reading the first set of data units from their corresponding memory locations according to the order of the third set of address locations. The dual-port memory receives a third data stream via the first one of the dual ports and further comprising sequentially writing third data units of the third data stream to corresponding memory locations according to the order of the second set of address locations, and generating the second data stream by sequentially reading the third set of data units from their corresponding memory locations according to the order of the third set of address locations.

In other features the computer program includes synchronizing generating an individual address from each of the first interleaved sequence of addresses, the second set of address locations, and the third set of address locations. The dual-port memory has less memory space than memory of the address locations. The computer program can include maintaining independent blocks of the address locations, wherein each block corresponds with an independent one of interleaving functions and deinterleaving functions between corresponding pairs of a plurality of first data streams and second data streams. The blocks are of equal size. The computer program can include generating an address corresponding to a selected one of the blocks based on a selected one of the corresponding pairs of first data streams and second data streams. The computer program can include dynamically determining a size of each block based on an interleaving depth associated with each block. The computer program can include one of a modulating step and a demodulating step. The computer program can include one of a transmitting step and a receiving step associated with a respective one of the modulating and demodulating steps. The computer program can include a very high bit-rate digital subscriber line (VDSL) communication computer program that includes the computer program.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
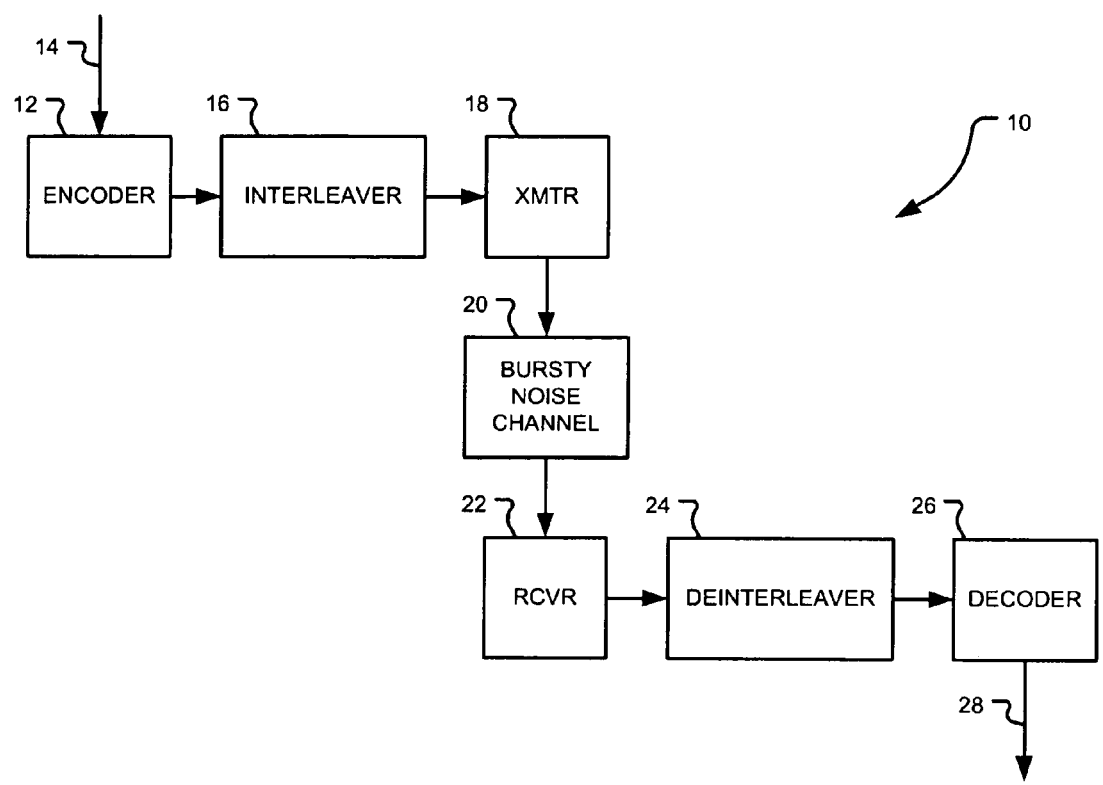
FIG. 1 is a functional block diagram of an interleaving communication system of the prior art.
Figure 2A:
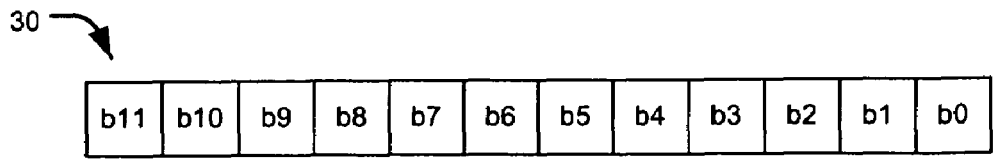
FIG. 2A is a data diagram of a block of data as it propagates through the interleaving communication system of FIG. 1 according to a block interleaving method.
Figure 2A:
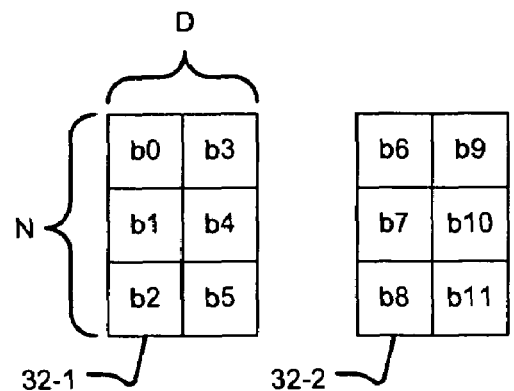
Figure 2A:
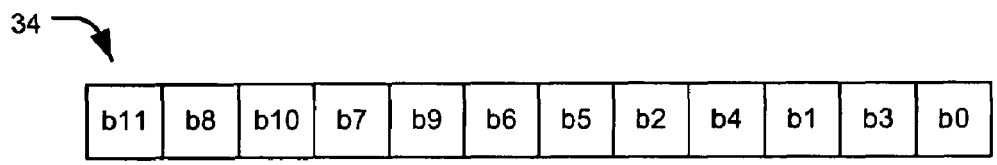
Figure 2A:
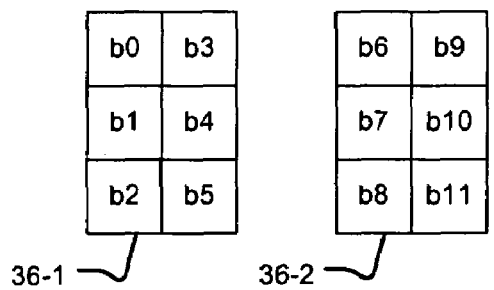
Figure 2A:
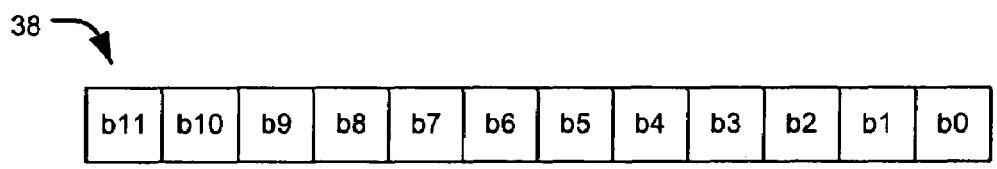
Figure 2B:
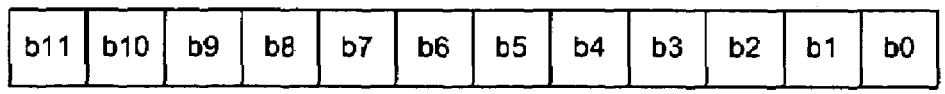
FIG. 2B is a data diagram of a block of data as it propagates through the communication system of FIG. 1 according to a general convolutional interleaving method.
Figure 2B:
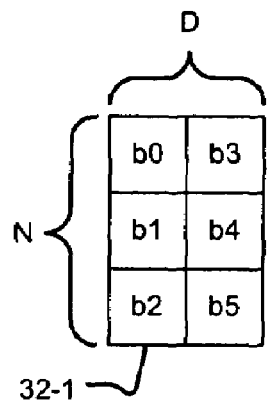
Figure 2B:
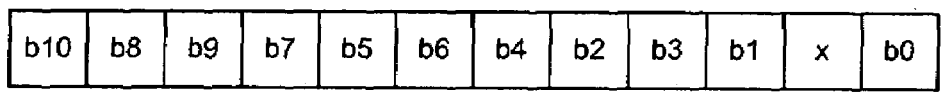
Figure 2B:
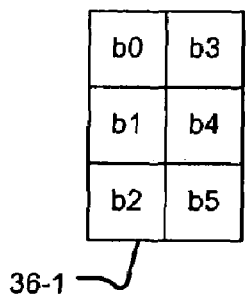
Figure 2B:
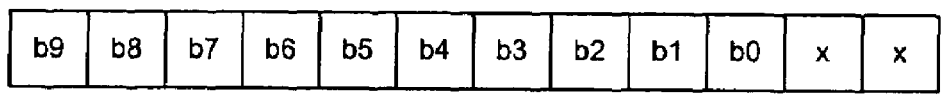

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Figure 3:
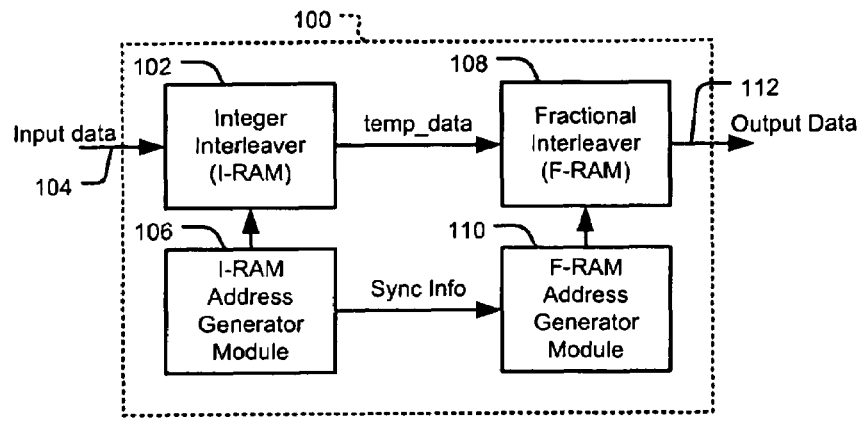
FIG. 3 is a functional block diagram of a general convolutional interleaver(GCI)

Referring now to FIG. 3, a functional block diagram is shown of a general convolutional interleaver (GCI) 100. GCI 100 includes an integer RAM (I-RAM) 102 that receives a data block via an input 104. An I-RAM address generator 106 communicates with I-RAM 102 and determines address locations for reading and writing data bytes during an integer portion of the interleaving process. For each interleaving step the determined read and write addresses are equal to each other. While the examples provided herein use a data block partitioned into bytes, the data block may be portioned into other data sizes, such as bits, nibbles, and 16-bit or larger words. I-RAM 102 communicates temporary data to an input of a fractional RAM (F-RAM) 108. F-RAM 108 can be implemented with RAM that includes substantially less memory space than I-RAM 102.

An F-RAM address generator 110 communicates with F-RAM 108 and determines address locations for reading and writing data bytes during a fractional portion of the interleaving process. For each interleaving step the determined read and write addresses are unequal to each other. An output 112 of F-RAM 108 communicates the interleaved data block for subsequent transmission through a channel. Both I-RAM 102 and F-RAM 108 can be implemented using single port RAM to reduce die size, power consumption, and cost when compared to prior art chips employing ping-pong RAM.

Details of the integer and fractional portions of the interleaving process are provided below. Methods used in I-RAM address generator 106 and F-RAM address generator 110 allow I-RAM 102 and F-RAM 108 to be implemented with less memory than required for the block interleaver of the prior art. A factor of four (4) can be saved over the BI method of the prior art. Also, GCI 100 supports all combinations of co-primed I and D where I is an integer and D is the interleaving depth.

Figure 4:
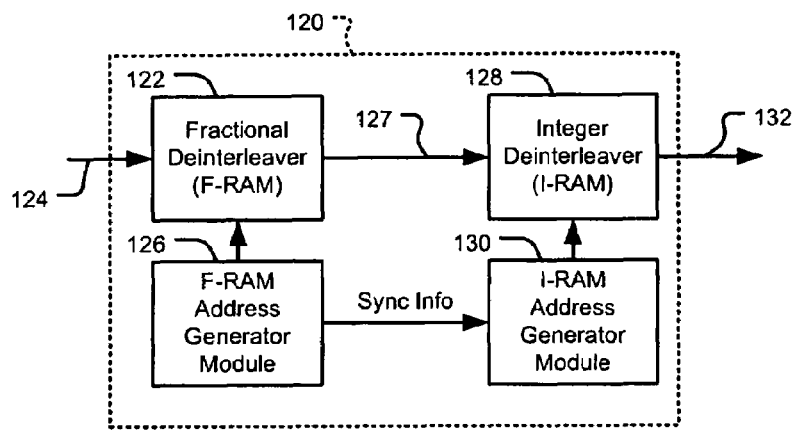
FIG. 4 is a functional block diagram of a general convolutional deinterleaver (GCD)

Referring now to FIG. 4, a functional block diagram is shown of a general convolutional deinterleaver (GCD) 120. GCD 120 includes an F-RAM 122 that receives the interleaved data block via an input 124. An F-RAM address generator 126 communicates with F-RAM 122 and determines address locations for reading and writing data bytes during a fractional portion of the deinterleaving process. F-RAM 122 communicates temporary data to an input 127 of an I-RAM 128. An I-RAM address generator 130 communicates with I-RAM 128 and determines address locations for reading and writing data bytes during an integer portion of the deinterleaving process. An output 132 of I-RAM 128 provides the deinterleaved data block. Output 132 generally communicates with an error-correcting module (not shown) that recovers data from bytes that were corrupted in the channel.

F-RAMs 108 and 122 have memory sizes that are smaller than their corresponding I-RAMs 102, 128. In an example implementation, GCI 100 and GCD 120 can be configured to comply with profile 30a of a presently proposed ITU VDSL2 specification, which is hereby incorporated by reference in its entirety. Such an implementation can accommodate a data rate of up to 200 megabits per second with 64 Kbyte I-RAMs 102, 128 and 256 byte F-RAMs 108 and 122. This is a substantial reduction in the usage of the ping-pong type of memory space when compared to prior block interleavers and deinterleavers with like capability.

Figure 5:
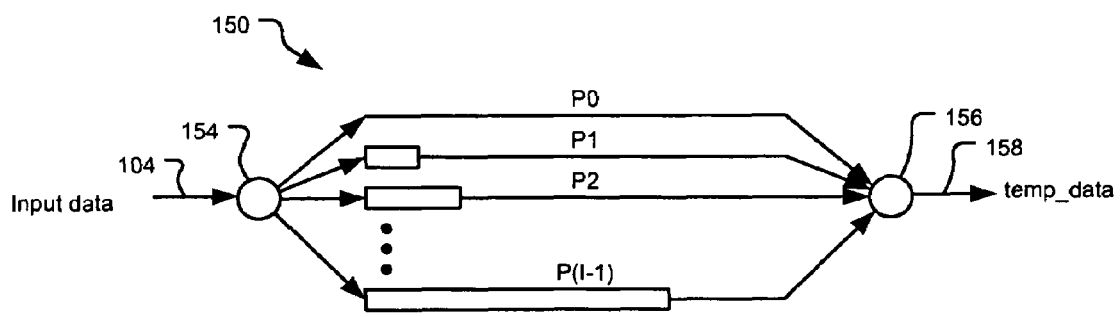
FIG. 5 is a data flow model of an integer portion of the GCI.

Referring now to FIG. 5, a functional model 150 is shown of I-RAM 102 and I-RAM address generator 106. Functional model 150 is useful to help visualize various algebraic variables and methods that are described below. Functional model 150 includes a multiplexer 154 that receives the data block from input 104 and sequentially directs each byte to one of digital delay line paths P0 through P(I−1), where I is the number of paths. Multiplexer 154 is initially synchronized with a header of the incoming data block. In some embodiments, the header can be a codeword of a Reed-Solomon error correcting code. A demultiplexer 156 is synchronized with multiplexer 154 and receives the delayed bytes from each delay line path. An output 158 of the demultiplexer 156 communicates partially interleaved data to the fractional portion of GCI 100.

The first data path P0 provides zero delay, and paths P1 through P(I−1) provide corresponding delays of ith_L bytes, where ith_L is the integer delay length of the of the $i^{th}$ path. Paths P0 through P(I−1) are realized with respective ith_I bytes of I-RAM 102 and a modulus ith_I address generated by I-RAM address generator 106. A minimum number of bytes needed for I-RAM 102 can be determined by summing the number of ith_L bytes for paths P1 through P(I−1).

Figure 6:
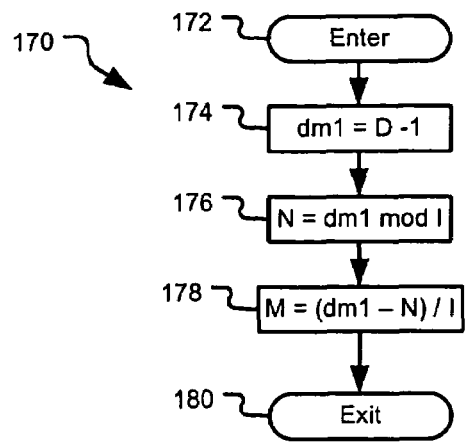
FIG. 6 is a flowchart of a method for determining parameters of the GCI.

Referring now to FIG. 6, a method 170 is shown for selecting parameters used by I-RAM address generator 106. Method 170 can be stored in a computer memory and executed by a microprocessor. In other embodiments, method 170 can be implemented with combinatorial and/or sequential logic. Method 170 is executed once after the interleaving depth D is chosen.

Control begins in block 172 and immediately proceeds to block 174 to define a variable dm1=D−1. Control then proceeds to block 176 and determines a fractional part index N based on the equation N=dm1 mod I. Control then proceeds to block 178 and determines an integer part index M based on the equation M=(dm1−N)/I. Control then exits through block 180. The address generator modules use the indices N and M as described further below.

Figure 7:
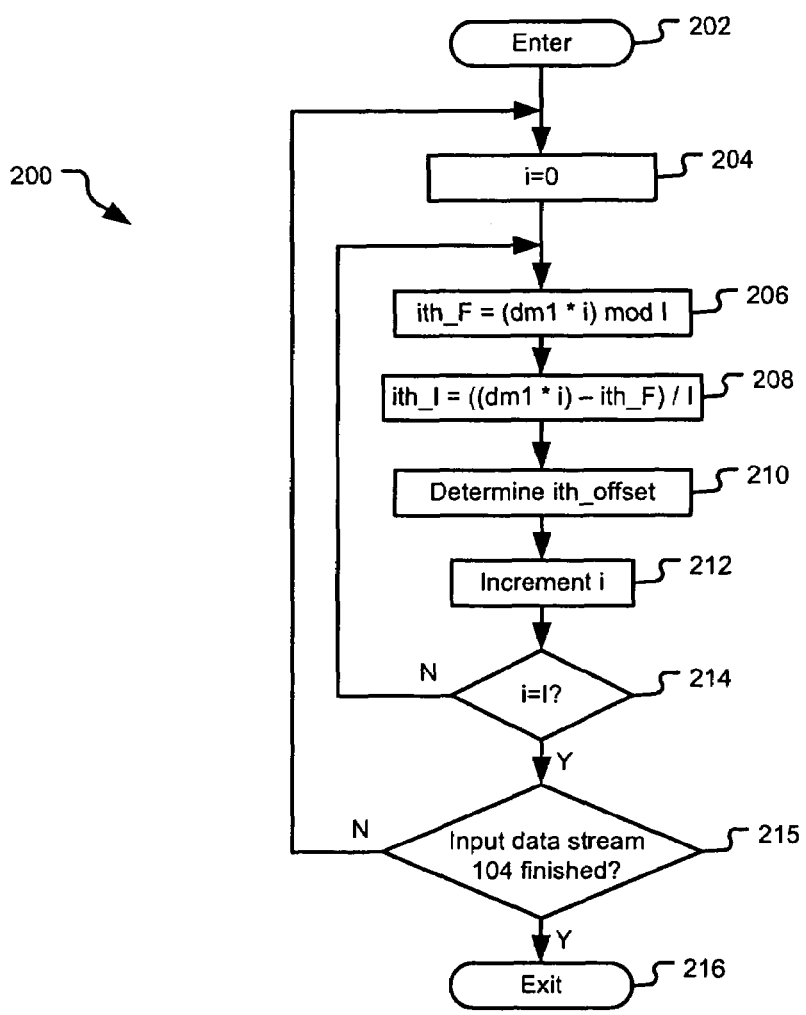
FIG. 7 is a flowchart of a method for delay calculation for the integer portion of the GCI.

Turning now to FIG. 7, a method 200 is shown for computing other parameters that are used by the address generator modules. Method 200 can be stored in a computer memory and executed by a microprocessor. In other embodiments, method 200 can be implemented with combinatorial and/or sequential logic.

Control begins in block 202 and immediately proceeds to block 204 and initializes an index i to zero. This i corresponds to the ith row in FIG. 5. Control then proceeds to block 206 and computes an index ith_F based on the equation ith_F=(dm1*i)mod 1. Control then proceeds to block 208 and computes an index ith_I based on the equation ith_I=((dm1*i)−ith_F)/I. Control then proceeds to block 210 and computes an index ith_offset to the sum of delay bytes in the delay paths (FIG. 5) preceding the ith delay path whose indices are currently being computed. Control then proceeds to block 212 and increments i before proceeding to decision block 214 and determining whether i=I. If i≠I, then control returns to block 206 to compute another set of parameters for the next delay path. If i=I, then control proceeds to block 215 and determines whether input data stream 104 has been interleaved. If there are still left over data in input data stream 104 then control returns to block 204. Otherwise, control exits through block 216.

Figure 8:
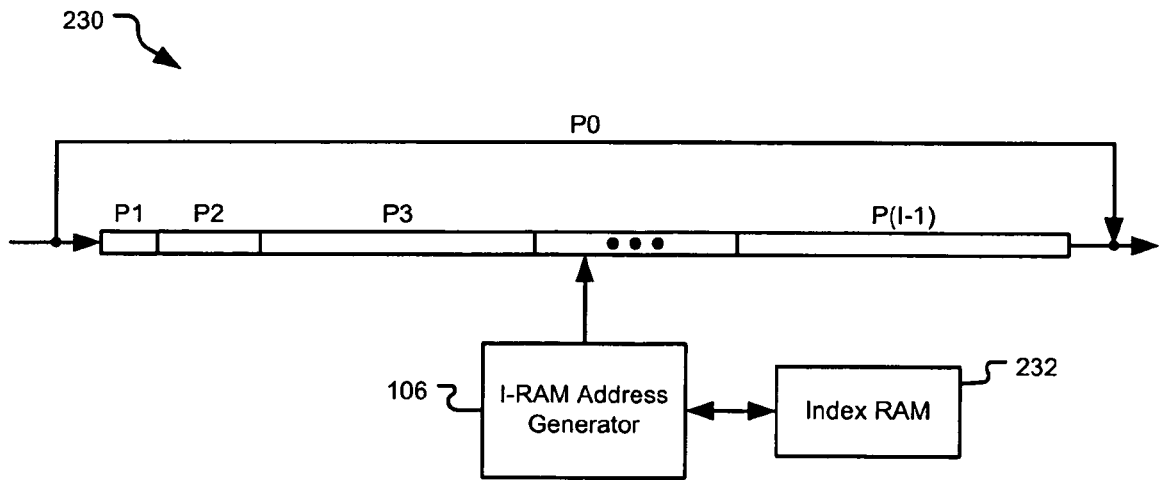
FIG. 8 is a functional block diagram of an integer portion of the GCI.

Referring now to FIG. 8, an address space 230 of I-RAM 102 is shown in communication with I-RAM address generator 106. The indices inside each row determined in methods 170 and 200 are maintained in an index RAM 232 that is in communication with I-RAM address generator 106. Address space 230 includes blocks of memory that represent the delay paths P0 through P(I−1) shown in FIG. 5. I-RAM address generator 106 employs indexed and indirect addressing modes to read and write once to each of the same address location in address space 230 for each interleaved byte. Address space 230 can be duplicated in a single I-RAM 102 when GCI 100 serves a corresponding plurality of communication channels. Each address space 230 is then referred to as a functional block, and I-RAM address generator generates an address of a particular byte in I-RAM 102 based on the equation Overall Address=Functional_Block_Offset+Row_Offset+(index inside row), where the Functional_Block_Offset is a beginning address of a corresponding address space 230, Row_offset is a beginning address of a delay path of the selected functional block, and (ith_index) is an value determined according to a method 250 described below.

Figure 9:
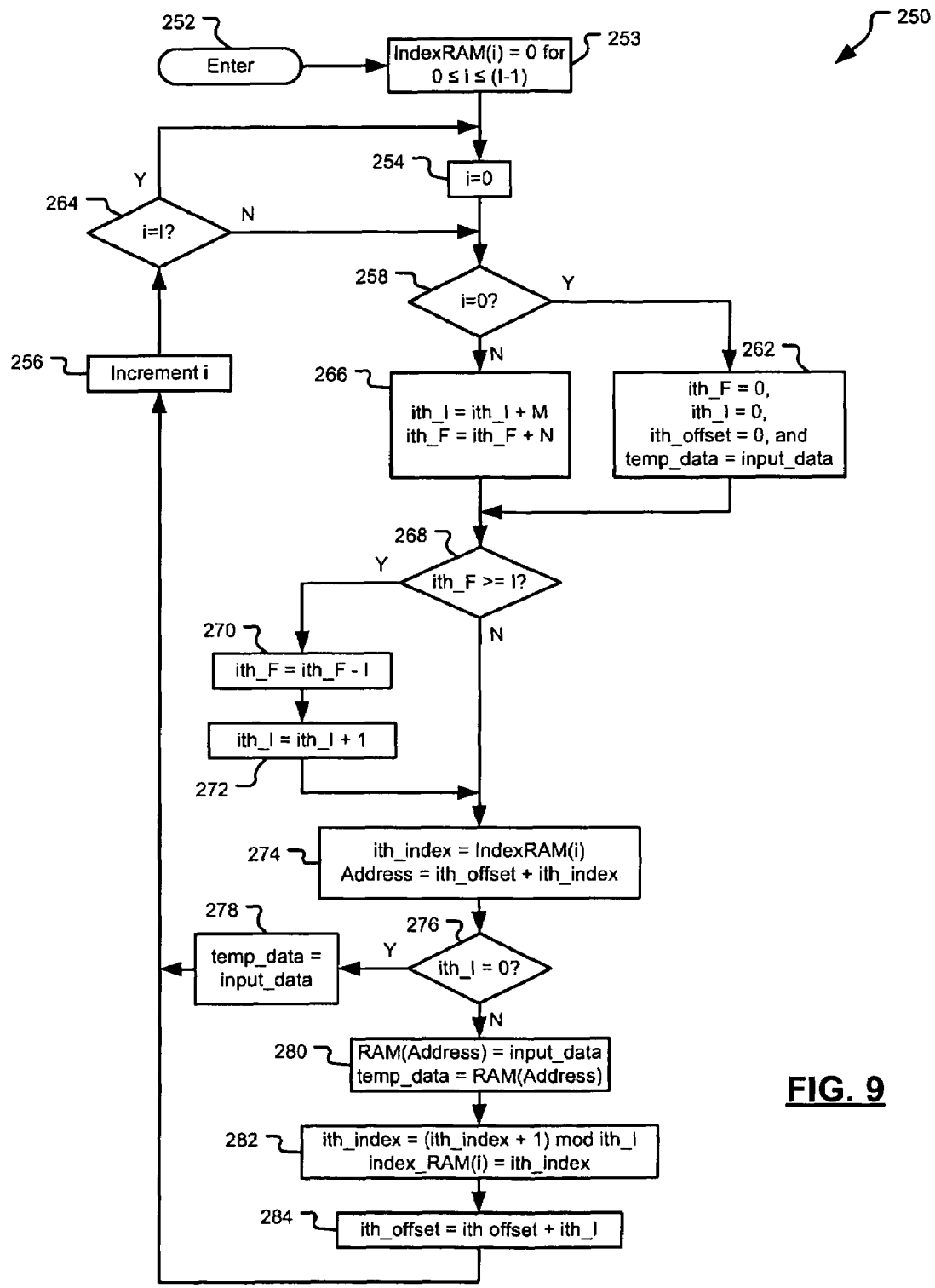
FIG. 9 is a flowchart of a method for addressing memory of the integer portion of the GCI.

Referring now to FIG. 9, a method 250 is shown for maintaining the indices described above and performing the integer portion of the interleaving operation. Method 250 is executed by I-RAM address generator 106 and can be stored in a computer memory and executed by a microprocessor. In other embodiments, method 250 can be implemented with combinatorial and/or sequential logic. Method 250 is executed once for each byte during the interleaving operation.

Control begins in block 252 and immediately proceeds to block 253 and clears the contents of index RAM 232 address locations 0 through (I−1). Control then proceeds to block 254 and initializes i to zero. Control then proceeds to decision block 258 and determines whether i=0. If i=0, then control is starting a new cycle though the delay paths (FIG. 5) and proceeds to block 262. In block 262, control resets ith_F, ith_I, and ith_offset to zero. Control also copies the byte appearing at input 104 directly to the input port of F-RAM 108. This copying step implements the digital delay of zero in delay path P0 (FIG. 5). Control then proceeds to decision block 268. If i≠0 in decision block 258, then control proceeds to block 266 to increment ith_I by M and increment ith_F by N. Control then proceeds to decision block 268 and determines whether ith_F is greater than or equal to I. If so, then control branches to block 270 to decrement ith_F by I and then branches to block 272 to increment ith_I by 1. Control then proceeds to block 274. Control also arrives at block 274 when ith_F is less than 1 in decision block 268.

In block 274, control determines the byte address in address space 230 based on the equation Address=ith_offset+ith_index, where ith_index is the contents of index RAM 232 at row i. Control then proceeds to decision block 276 and determines whether ith_I is equal to zero. If so, then control branches to block 278 and copies the byte appearing at input 104 directly to the input port of F-RAM 108. Control then proceeds to block 276. If ith_I≠0 in decision block 276, then control branches to block 280.

In block 280, control copies the byte from I-RAM 102 at location Address to the input of F-RAM 108 and copies the byte appearing at input 104 to location Address of I-RAM 102. Control then proceeds to block 282 and updates ith_index based on the equation ith_index=(ith_index+1)mod ith_I. Control then proceeds to block 284 and updates ith_offset based on the equation ith_offset=ith_offset+ith_I. Control then returns to block 256.

In block 256 control increments I and then proceeds to decision block 264. In decision block 264 control determines whether i=I. If i=I, then control branches to block 254 and resets i to zero. Otherwise, control branches to decision block 258.

Figure 10:
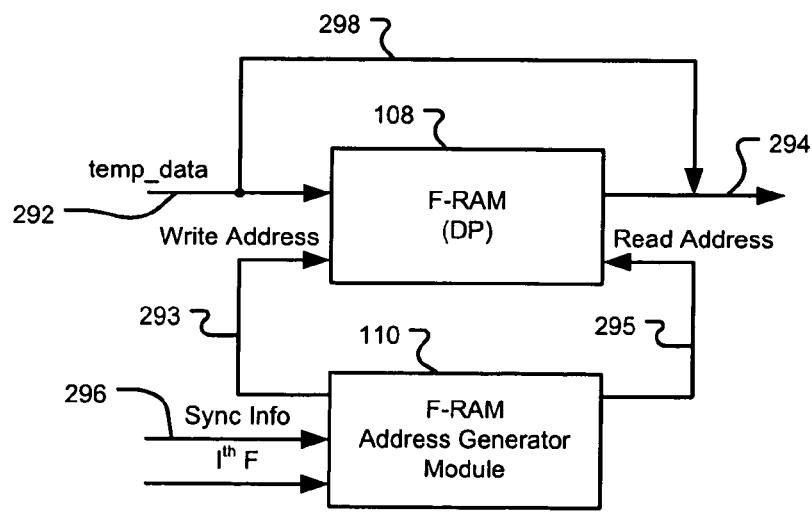
FIG. 10 is a functional block diagram of a fractional portion of the GCI.

Referring now to FIG. 10, a detailed functional block diagram is shown of F-RAM 108 and F-RAM address generator 110. In some embodiments, F-RAM 108 is a two port RAM. F-RAM 108 can also be implemented with a single-port RAM. F-RAM 108 includes an input port 292 that receives the data copied out of I-RAM 102. F-RAM 108 also includes an output port 294 that communicates the interleaved data for transmission over the channel.

F-RAM address generator 110 generates a Write Address 293 and Read Address 295 based on methods described below. F-RAM address generator 110 also receives the variable ith_F and a synchronization signal 296, such as index i, from I-RAM address generator 106. When Write Address and Read Address are equal, the data appearing at input port 292 is immediately read from output port 294 to provide zero delay as symbolized by line 298.

During interleaving F-RAM address generator 110 generates the Read Address in accordance with a mod I counter. That is, the Read Address follows a pattern 0, 1, 2, ..., (I−1), 0, 1, 2, ..., (I−1), ... throughout the interleaving process. The Write address is generated in accordance with the equation Write Address=(Read Address+ith_F)mod I. When Write Address and Read Address are unequal, the effective delay between input port 292 and output port 294 is ith_F.

Figure 11:
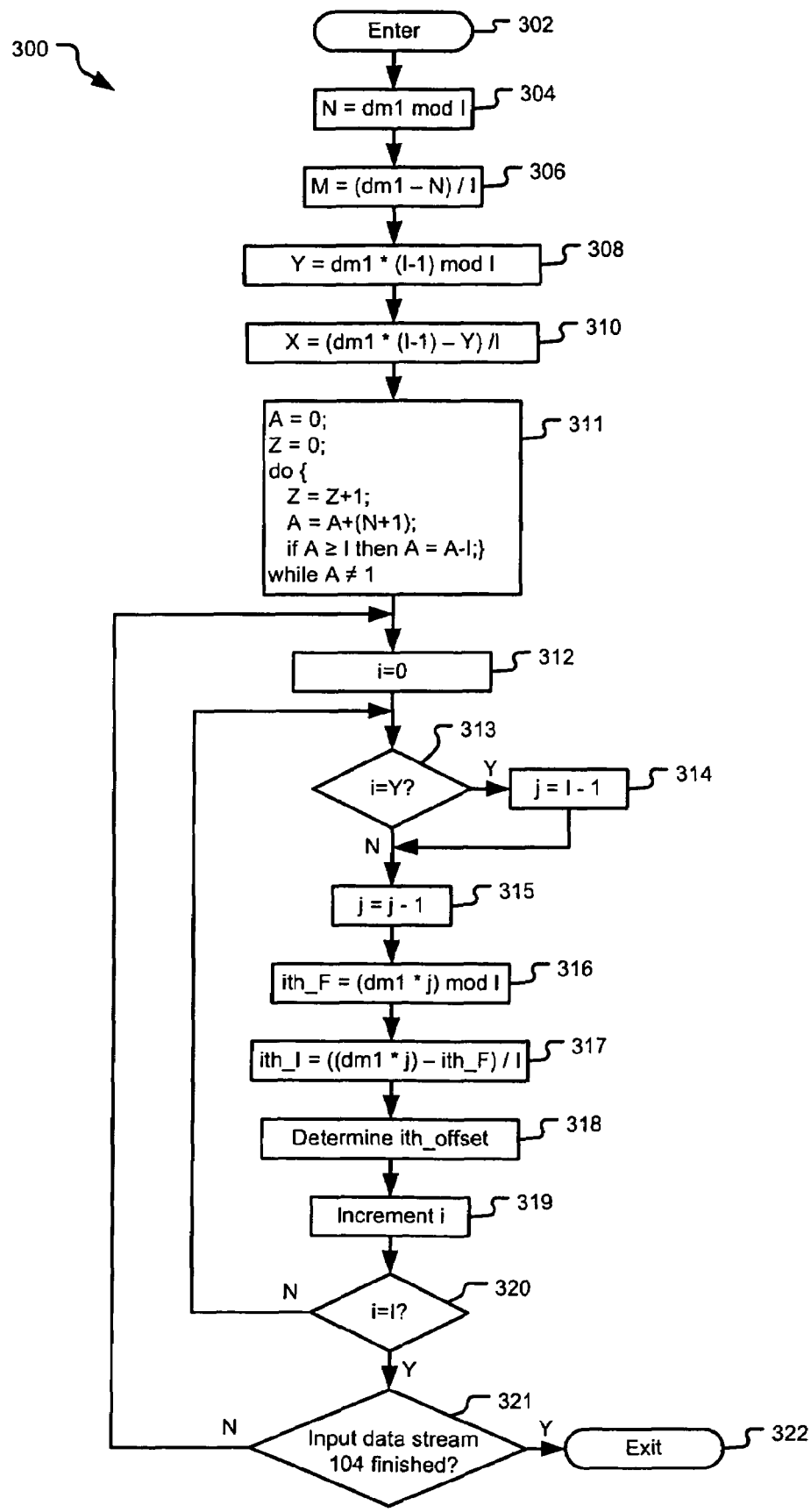
FIG. 11 is a flowchart of a method for initialization and delay calculation for an integer portion of the GCD.

Referring now to FIG. 11, a method 300 is shown for computing parameters that are used by I-RAM address generator 130 of GCD 120. Method 300 can be stored in a computer memory and executed by a microprocessor. In other embodiments, method 300 can be implemented with combinatorial and/or sequential logic. Method 300 should be started such that execution of blocks 302-311 is completed before doing any deinterleaving.

Control enters at step 302 and immediately proceeds to block 304 to determine an integer N based on the equation N=dm1 mod I. Control then proceeds to block 306 and determines an integer M based on the equation M=(dm1−N)/I.

Control then proceeds to block 308 and determines an integer Y based on the equation dm1*(I−1)mod I, where Y represents a fractional part of the longest length of the delay lines (FIG. 5). Control then proceeds to block 310 and determines an integer X based on the equation X=(dm1*(I−1)−Y)/I, where X represents an integer part of the longest length of the delay lines (FIG. 5).

Control then proceeds to block 311 and determines an integer Z. The integer Z is used to determine which row of the interleaved I-RAM the $2^{nd}$ byte of the interleaved bytes (i.e. at input 124 of GCD 120) is from. The integer Z is determined based on the following algorithm. An integer A and the integer Z are initialized to zero. Then, while A≠1, the algorithm of block 311 repeatedly increments Z, increments A by N+1, and, if A≧I, decrements A by I. If I and D are relatively prime then the aforementioned "while" loop finishes within I loops.

Control then proceeds to block 312 and sets i equal to zero. Control then proceeds to decision block 313 and determines whether i=Y. If so, control branches to block 314 and sets j equal to I−1 before continuing to block 315. If the result in decision block 313 was negative, then control branches to block 315 and decrements j. Control then proceeds to block 316 and determines ith_F in accordance with the equation ith_F=(dm1*j)mod I. Control then proceeds to block 317 and determines ith_I in accordance with the equation ((dm1*j)−ith_F)/I. Control then proceeds to block 318 and determines index ith_offset based on the sum of delay bytes in the delay paths (FIG. 5) preceding the jth delay path currently being processed. Control then proceeds to block 319 and increments i. Control then continues to decision block 320 and determines whether i=I. If not, then control branches back to decision block 313. If so, then control branches to decision block 321 and determines whether method 300 has processed all of input data stream 104. If not, then control returns to block 312. Otherwise control exits through block 322.

Figure 12:
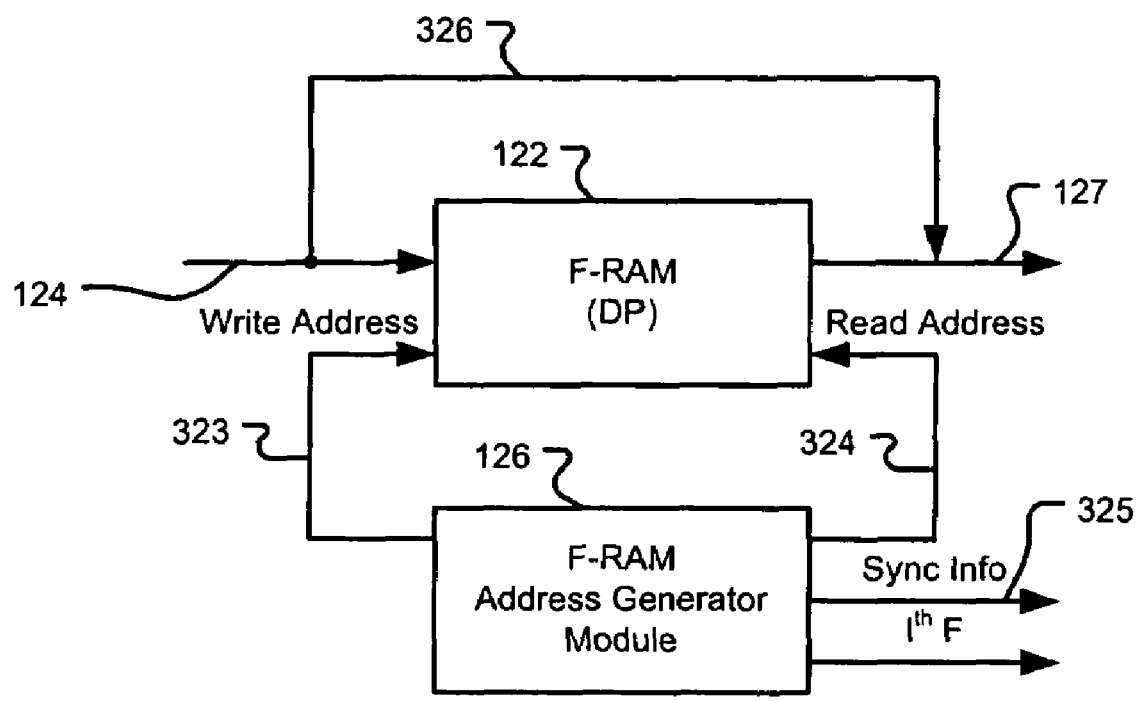
FIG. 12 is a functional block diagram of a fractional portion of the GCD.

Referring now to FIG. 12, a detailed functional block diagram is shown of deinterleaver F-RAM 122 and F-RAM address generator 126. In some embodiments F-RAM 122 can be implemented with a two-port RAM. In other embodiments F-RAM 122 can be implemented with a single-port RAM. Input port 124 receives interleaved data. Output port 127 communicates partially-deinterleaved data to I-RAM 128 of deinterleaver 120.

F-RAM address generator 126 generates a Write Address 323 and Read Address 324 based on methods described below. Data arriving at input 122 is written to respective Write Addresses 323 and data generated at output 127 is read from respective Read Addresses 324. F-RAM address generator 126 also generates the variable ith_F and a synchronization signal 325, such as index i, that are communicated to I-RAM address generator 130 of deinterleaver 120.

The addresses generated by the F-RAM address generator 126 during deinterleaving will now be described. Read Addresses 324 are generated accordance with a mod I counter, e.g. 0, 1, 2, ..., (I−1), 0, 1, 2, ..., (I−1), throughout the deinterleaving process. Write Addresses 323 are initialized to Y upon deinterleaver 120 receiving the beginning of each interleaved data stream 104. Write Addresses 323 are then generated with each received byte based on Write Address=Write Address+Z. If Write Address >=I, then Write Address is reset to Write Address−I. The effective delay between input port 124 and output port 127 is ith_F when Write Address 323 and Read Address 324 are unequal. When Write Address 323 and Read Address 324 are equal, the data appearing at input port 124 is immediately provided at output port 127 to provide zero delay as symbolized by line 326.

Figure 13:
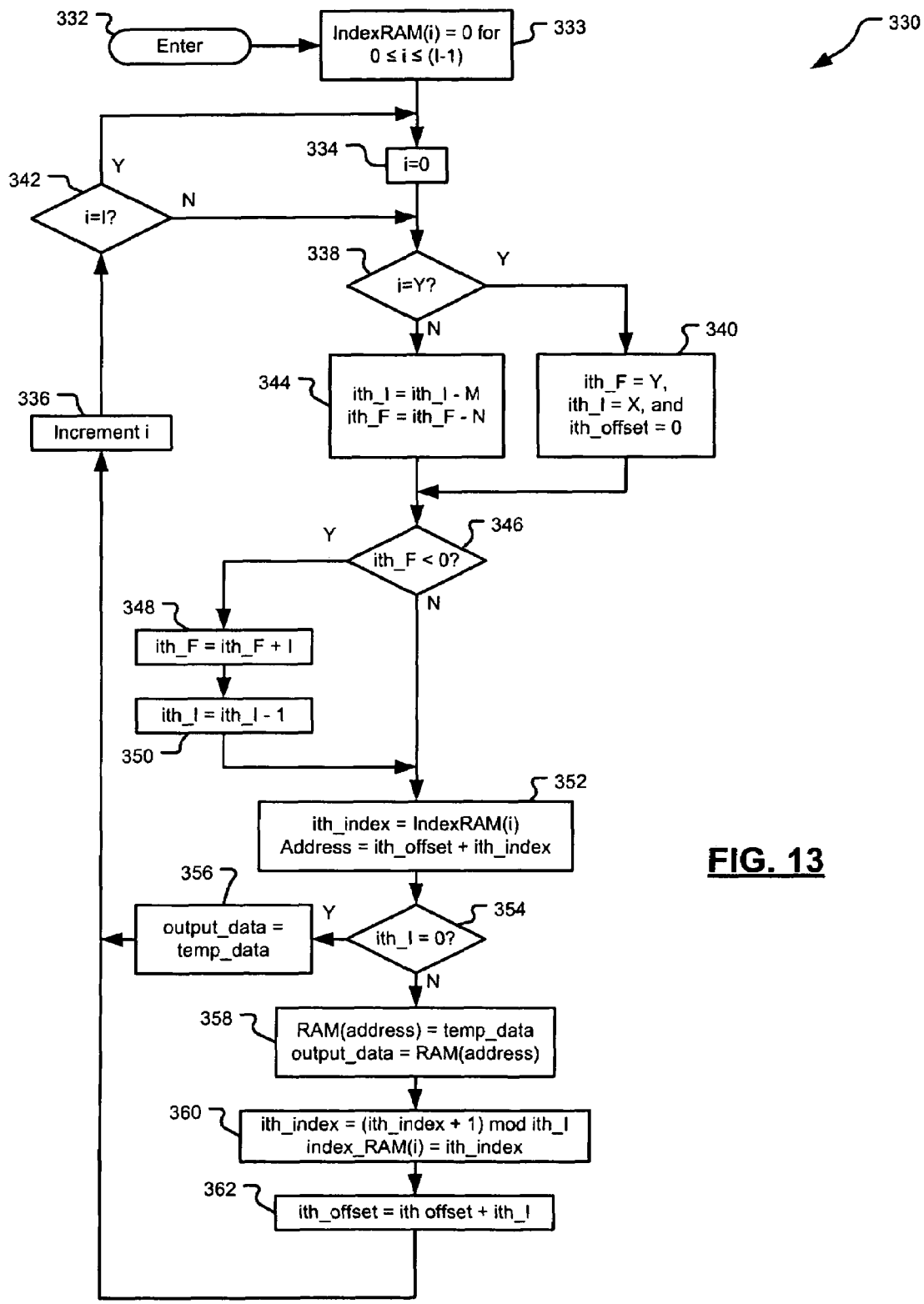
FIG. 13 is a flowchart of a method for addressing memory of the integer portion of the GCD.

Referring now to FIG. 13, a method 330 is shown for maintaining the indices described above and performing the integer portion of the deinterleaving operation. Method 330 is executed by I-RAM address generator 130 and can be stored in a computer memory and executed by a microprocessor. In other embodiments, method 330 can be implemented with combinatorial and/or sequential logic. Method 330 is executed continuously during the deinterleaving operation.

Control begins in block 332 and immediately proceeds to block 333 to clear index RAM 232 address locations 0 through (I−1). Control then proceeds to block 334 to initialize i with zero. Control then proceeds to decision block 338 and determines whether i=Y. If i=Y, then control is processing data received from the first delay path P0 (FIG. 5) and branches to block 340. In block 340, control resets ith_F to Y, ith_I to X, and ith_offset to zero. Control then branches to decision block 346. If i≠Y in decision block 338, then control proceeds to decision block 344 and decrements ith_F by N and decrements Ith_I by M. Control then proceeds to decision block 346 and determines whether ith_F is less than zero. If so, control branches to block 348 to increment ith_F by I and then proceeds to block 350 to decrement ith_I by 1. Control then proceeds to block 352. Control also branches to block 352 when ith_F is not less than 0 in decision block 346.

In block 352, control determines an address location of I-RAM 128 based on the equation Address=ith_offset+ith_index. Control then proceeds to decision block 354 and determines whether ith_I is equal to zero. If so, then control branches to block 356 and copies the temp_data byte appearing at input 127 directly to output 132 (FIG. 4). Control then returns to block 336. If ith_I≠0 in decision block 354, then control branches to block 358.

In block 358, control copies the byte from I-RAM 128 at location Address to output 132 and copies the byte appearing at input 127 to location Address of I-RAM 128. Control then proceeds to block 360 and updates ith_index based on the equation ith_index=(ith_index+1)mod ith_I. Control then stores ith_index at row i in index RAM 232. Control then proceeds to block 362 and updates ith_offset based on the equation ith_offset=ith_offset+ith_I. Control then returns to block 336.

In block 336 control increments i and then proceeds to decision block 342. In decision block 342 control determines whether i=I. If i=I, then control branches to block 334 and resets i to zero. Otherwise control branches to decision block 338.

GCI 100 and GCD 120 can also support an existing triangular convulational interleaver (TCI) by choosing N=0. TCI is specified in ITU standard ITU-G.993.1, which is hereby incorporated by reference in its entirety, for VDSL-1. In this case, I is chosen to be divisible by (D−1) and (D−1)/I=M. ith_F is zero for all paths (FIG. 5) and ith_I=0, M, 2M, 3M, . . . , which implements TCI. Since ith_F=0 for all paths, the Write Address and Read Address are always equal from F-RAM address generator 110 and F-RAM 108 is effectively bypassed. Implementing the TCI allows GCI 100 and GCD 120 to communicate with existing devices that also use TCI.

Figure 14:
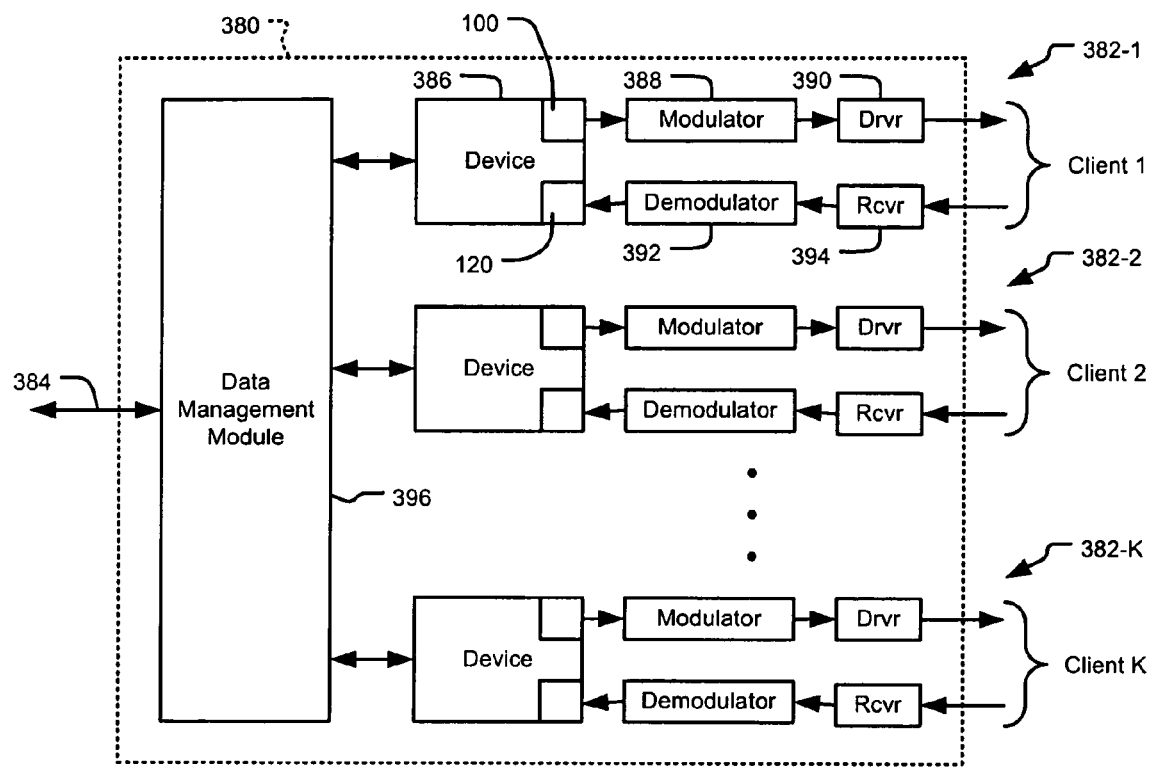
FIG. 14 is a functional block diagram of an asynchronous digital subscriber line (ADSL) system that includes the GCI and GCD.

Referring now to FIG. 14, a functional block diagram is shown of an implementation of the present invention. A digital subscriber line (DSL) card 380 is adapted for installation in a telephone central office. Card 380 includes a plurality of channels 382-1, 382-2, . . . , 382-K, referred to collectively as channels 382, that provide a bridge between respective clients and an internetwork 384, such as the Internet. In a typical application K=16, however other values of K may also be used.

Each channel 382 includes a modulator 388 that communicates data to a line driver 390, and a line receiver 394 that communicates data to a demodulator 392. A digital device module 386 includes GCI 100 that communicates interleaved data to modulator 388. Digital device module 386 also includes GCD 120 that receives interleaved data from demodulator 392. Digital device module 386 can also include other modules, such as one or more of a Fast-Fourier Transform (FFT), Inverse FFT, asynchronous transfer mode (ATM) interface, memory, and error correction modules. A data management module 396 coordinates the flow of data between each of channels 382 and internetwork 384.

Figure 15:
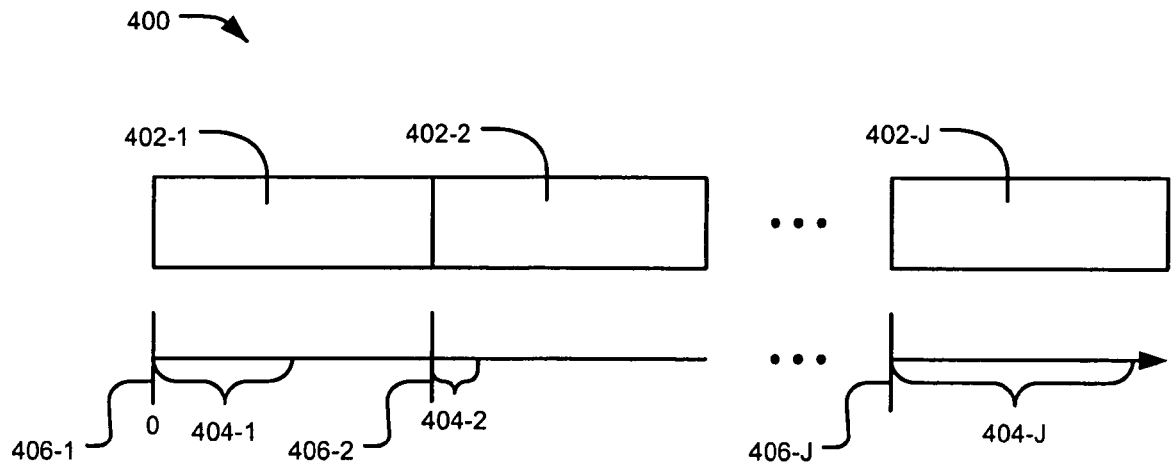
FIG. 15 is a memory map for implementing a plurality of integer portions of GCIs and/or GCDs within a one-dimensional RAM.

Referring now to FIG. 15, a memory map 400 is shown of a single-port RAM that is conceptually divided into a plurality of I-RAMs 102 and/or 130. Using a single-port RAM to implement a plurality of I-RAMs provides economical and configurability benefits when an application includes a plurality of GCIs 100 and GCDs 120, such as card 380. Memory map 400 includes functional blocks 402-1, 402-2, . . . , 402-J, referred to collectively as functional blocks 402. Each functional block 402 implements a respective one of I-RAM 102 or 130 and is organized according to memory space 230 (FIG. 8). I-RAM address generators 106 and 130 can access individual memory locations in their respective functional block 402 by adding a respective one of block offsets 406 to their respective row offset 404 (from method 250 or 330, depending on whether functional block 402 is being used for interleaving or deinterleaving, respectively.)

The size of each functional block 402 can be equal or varied, depending on the needs of the associated client and channel. In some embodiments, the size of functional block 402 can be predetermined according to the equation ((I−1)*(D−1))/2, which indicates the maximum amount of I-RAM memory that is used by methods 250 and 330. In other embodiments, the size of each functional block 402 can be dynamically determined and/or altered as GCIs 100 and GCDs 120 are running.

Figure 16:
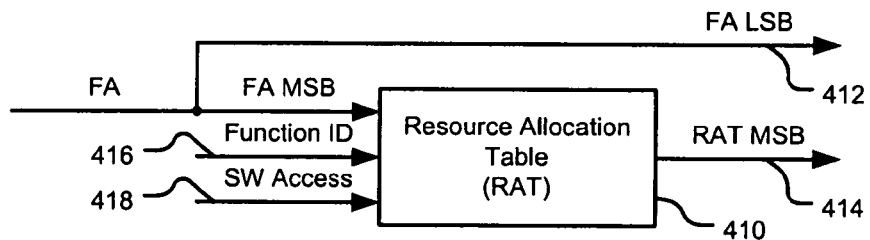
FIG. 16 is a functional block diagram of a resource allocation table (RAT) module for allocating and accounting memory space in the one-dimensional RAM.

Referring now to FIG. 16, a resource allocation table (RAT) module 410 is shown. RAT module 410 dynamically maps I-RAM memory space of GCIs 100 and/or GCDs 120 to corresponding functional blocks 402. RAT module 410 also remembers the size of each functional block 402. RAT module 410 generates a RAT address output 414 that can be concatenated with Address (at functional address output 412) from methods 250 and/or 330. The concatenated addresses 412, 414 provide a fully qualified address. RAT module 410 can be programmed with a minimum sector size of memory map 400 and maintain tags of free memory within memory map 400. The minimum sector size corresponds with the weight of the least significant bit of the RAT address output 414. In some embodiments, the minimum sector size includes 1 KByte. When an application determines its desired function block size, RAT module 410 rounds up the determined size to the next multiple of the sector size.

RAT module 410 also receives a function ID signal 416 that indicates which functional block 402 is currently being accessed. A software input 418 allows data in RAT module 410 to be read and/or written. This makes the SW capable of maintaining and modifying the shared memory resource to be dynamically re-allocated if some dynamically changing requirements happened. Examples of data include the free memory tags and desired size of a functional block 402, respectively, and/or other data related to managing memory space 400

GCI 100 and GCD 120 can also be implemented for use with a wireless channel. For wireless network applications, please refer to IEEE standards 802.11, 802.11a, 802.11b, 802.11g, 802.11h, 802.11n, 802.16, and 802.20. Also refer to Bluetooth if applicable. The aforementioned specifications are hereby incorporated by reference in their entirety.

Figure 17A:
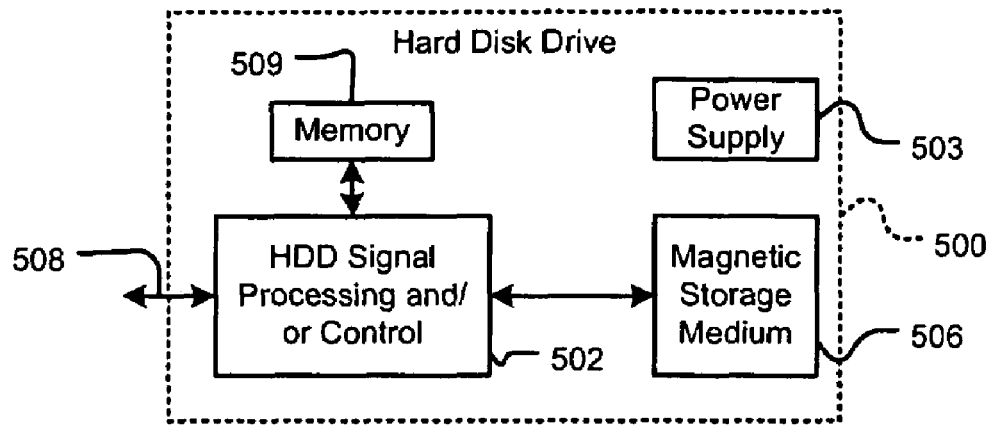
FIG. 17A is a functional block diagram of a hard disk drive.

Referring now to FIGS. 17A-17G, various exemplary implementations of the present invention are shown. Referring now to FIG. 17A, the present invention can be implemented in a hard disk drive 500. The present invention may be implemented in either or both signal processing and/or control circuits, which are generally identified in FIG. 17A at 502. In some implementations, the signal processing and/or control circuit 502 and/or other circuits (not shown) in the HDD 500 may process data, perform coding and/or encryption, perform calculations, and/or format data that is output to and/or received from a magnetic storage medium 506.

The HDD 500 may communicate with a host device (not shown) such as a computer, mobile computing devices such as personal digital assistants, cellular phones, media or MP3 players and the like, and/or other devices via one or more wired or wireless communication links 508. The HDD 500 may be connected to memory 509 such as random access memory (RAM), low latency nonvolatile memory such as flash memory, read only memory (ROM) and/or other suitable electronic data storage. The HDD 500 may also include a power supply 503

Figure 17B:
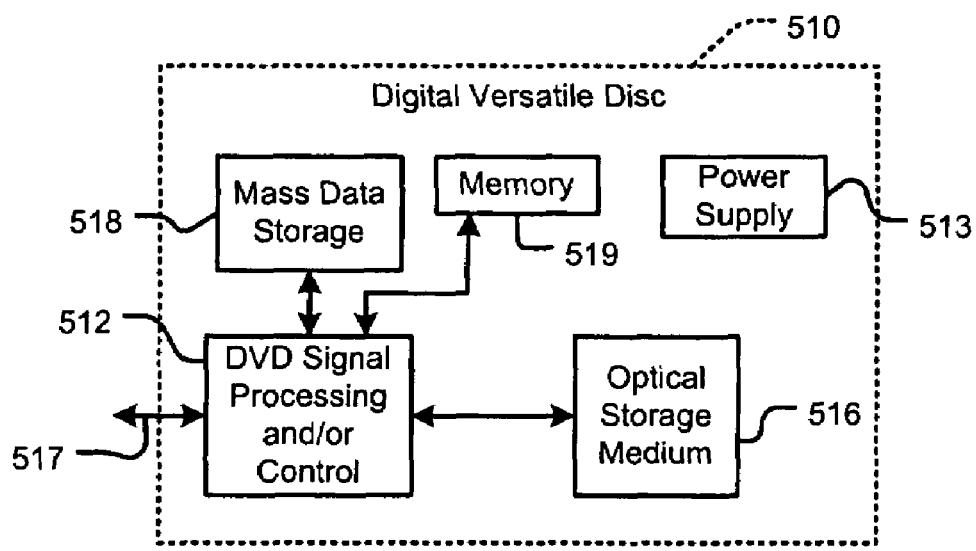
FIG. 17B is a functional block diagram of a digital versatile disk (DVD)

Referring now to FIG. 17B, the present invention can be implemented in a digital versatile disc (DVD) drive 510. The present invention may be implemented in either or both signal processing and/or control circuits, which are generally identified in FIG. 17B at 512. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and/or other circuits (not shown) in the DVD 510 can also perform other functions such as encoding and/or decoding and/or any other signal processing functions associated with a DVD drive.

The DVD drive 510 may communicate with an output device (not shown) such as a computer, television or other device via one or more wired or wireless communication links 517. The DVD drive 510 may communicate with mass data storage 518 that stores data in a nonvolatile manner. The mass data storage 518 may include a hard disk drive (HDD). The HDD may have the configuration shown in FIG. 17A. The HDD may be a mini HDD that includes one or more platters having a diameter that is smaller than approximately 1.8". The DVD drive 510 may be connected to memory 519 such as RAM, ROM, low latency nonvolatile memory such as flash memory and/or other suitable electronic data storage. The DVD drive 510 may also include a power supply 503.

Figure 17C:
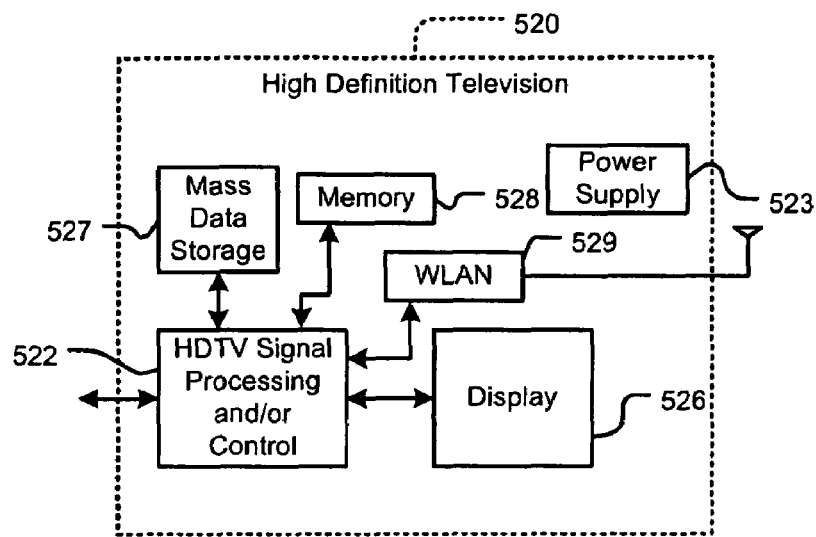
FIG. 17C is a functional block diagram of a high definition television.

Referring now to FIG. 17C, the present invention can be implemented in a high definition television (HDTV) 520. The present invention may be implemented in a WLAN interface 529. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as optical and/or magnetic storage devices. At least one HDD may have the configuration shown in FIG. 17A and/or at least one DVD may have the configuration shown in FIG. 17B. The HDD may be a mini HDD that includes one or more platters having a diameter that is smaller than approximately 1.8". The HDTV 520 may be connected to memory 528 such as RAM, ROM, low latency nonvolatile memory such as flash memory and/or other suitable electronic data storage. The HDTV 520 also may support connections with a WLAN via the WLAN interface 529. The HDTV 520 may also include a power supply 523.

Figure 17D:
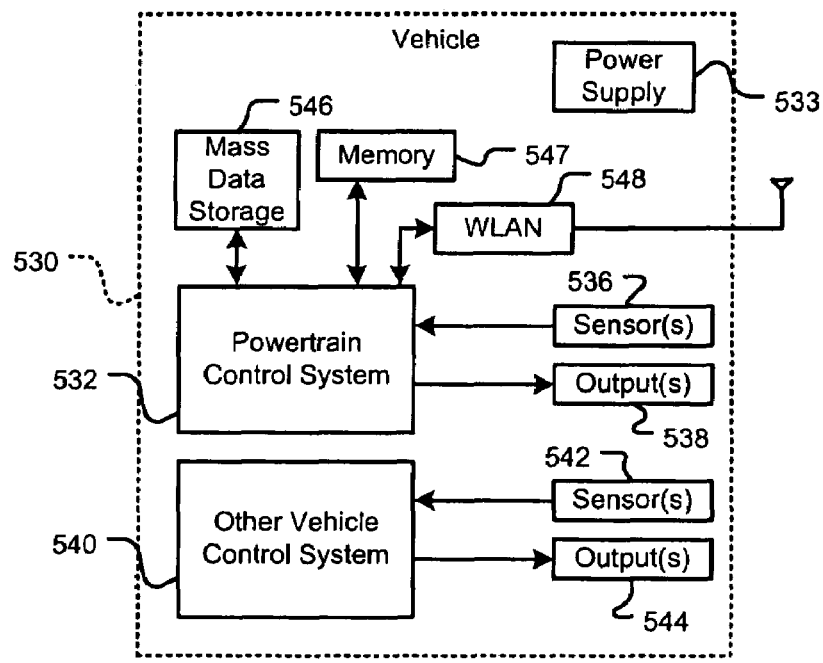
FIG. 17D is a functional block diagram of a vehicle control system.

Referring now to FIG. 17D, the present invention may implement and/or be implemented in a WLAN interface 548. A powertrain control system 532 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

A control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The powertrain control system 532 may be connected to memory 547 such as RAM, ROM, low latency nonvolatile memory such as flash memory and/or other suitable electronic data storage. The powertrain control system 532 also may support connections with a WLAN via the WLAN interface 548. The control system 540 may also include mass data storage, memory and/or a WLAN interface (all not shown). The vehicle 530 may also include a power supply 533.

Figure 17E:
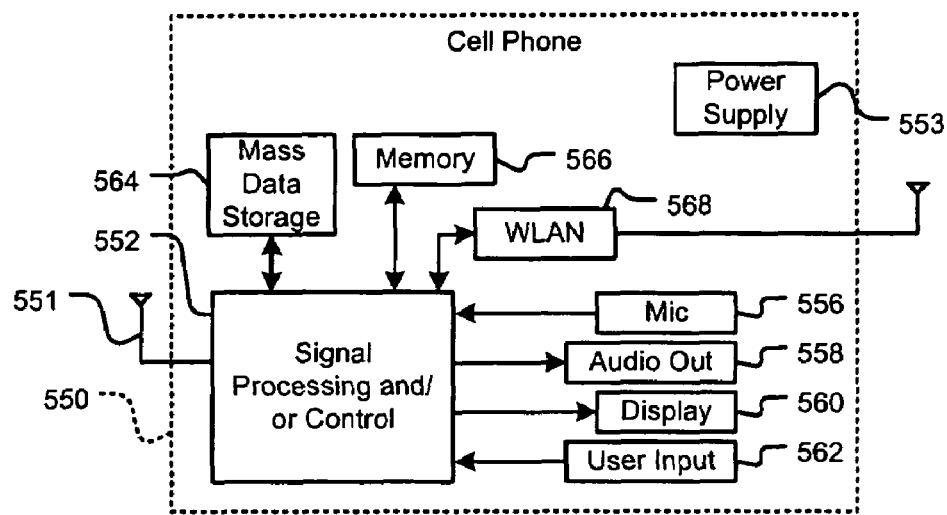
FIG. 17E is a functional block diagram of a cellular phone.

Referring now to FIG. 17E, the present invention can be implemented in a cellular phone 550 that may include a cellular antenna 551. The present invention may implement and/or be implemented in a WLAN interface 568. In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The cellular phone 550 may be connected to memory 566 such as RAM, ROM, low latency nonvolatile memory such as flash memory and/or other suitable electronic data storage. The cellular phone 550 also may support connections with a WLAN via the WLAN interface 568. The cellular phone 550 also may include a power supply 553.

Figure 17F:
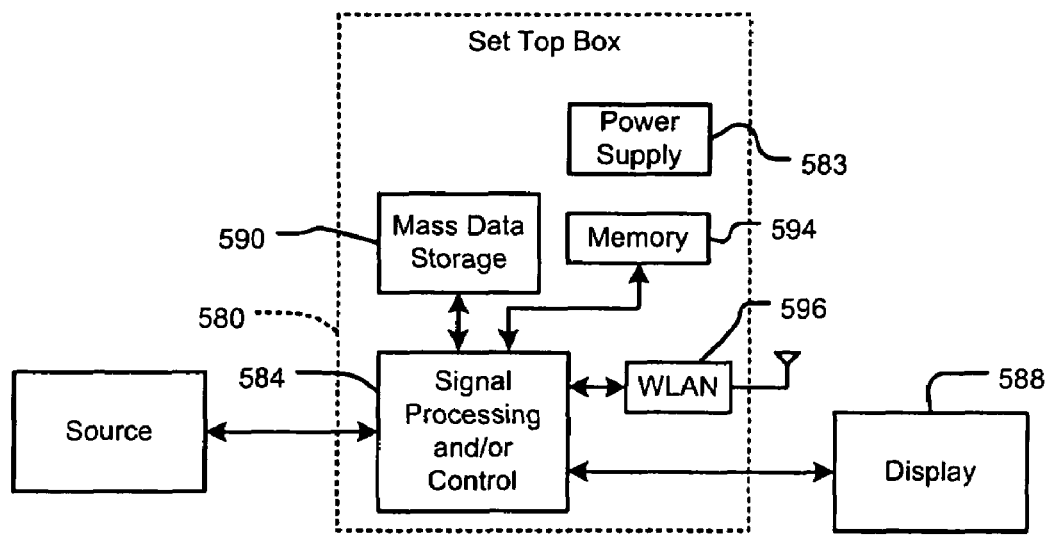
FIG. 17F is a functional block diagram of a set top box.

Referring now to FIG. 17F, the present invention can be implemented in a set top box 580. The present invention may be implemented in a WLAN interface 596. The set top box 580 receives signals from a source such as a broadband source and outputs standard and/or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices for example hard disk drives HDD and/or DVDs. At least one HDD may have the configuration shown in FIG.

17A and/or at least one DVD may have the configuration shown in FIG. 17B. The HDD may be a mini HDD that includes one or more platters having a diameter that is smaller than approximately 1.8". The set top box 580 may be connected to memory 594 such as RAM, ROM, low latency nonvolatile memory such as flash memory and/or other suitable electronic data storage. The set top box 580 also may support connections with a WLAN via the WLAN interface 596. The set top box 580 also may include a power supply 583.

Figure 17G:
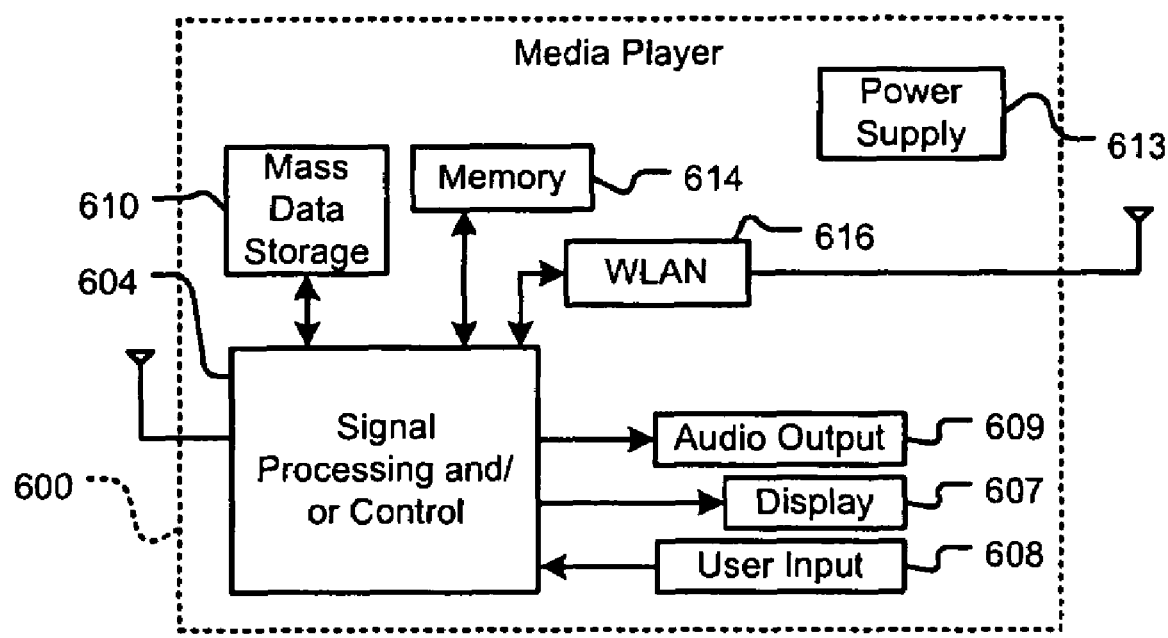
FIG. 17G is a functional block diagram of a media player.

Referring now to FIG. 17G, the present invention can be implemented in a media player 600. The present invention may be implemented in a WLAN interface 616. In some implementations, the media player 600 includes a display 607 and/or a user input 608 such as a keypad, touchpad and the like. In some implementations, the media player 600 may employ a graphical user interface (GUI) that typically employs menus, drop down menus, icons and/or a point-and-click interface via the display 607 and/or user input 608. The media player 600 further includes an audio output 609 such as a speaker and/or audio output jack. The signal processing and/or control circuits 604 and/or other circuits (not shown) of the media player 600 may process data, perform coding and/or encryption, perform calculations, format data and/or perform any other media player function.

The media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The media player 600 may be connected to memory 614 such as RAM, ROM, low latency nonvolatile memory such as flash memory and/or other suitable electronic data storage. The media player 600 also may support connections with a WLAN via the WLAN interface 616. The media player 600 may also include a power supply 613. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A circuit for performing interleaving and deinterleaving functions in a digital communication system, the circuit comprising:
    a single-port memory module that reads first data units from memory locations referenced by a first interleaved sequence of addresses to generate a first data stream, and that writes second data units from a second data stream to the memory locations; and
    a first address generator module that communicates with the single-port memory and generates the first interleaved sequence of addresses based on one of an interleaving function and a deinterleaving function between the first data stream and the second data stream.

2. The circuit of claim 1 wherein the single-port memory module performs each read immediately prior to performing each write for each of the memory locations.

3. The circuit of claim 2 wherein each read and write are associated with the same memory location.

4. The circuit of claim 1 wherein the interleaving function includes a triangular convolutional interleaving (TCI) function.

5. The circuit of claim 1 further comprising a dual-port memory module that communicates with the single-port memory module.

6. The circuit of claim 5 further comprising a second address generator module that communicates with the dual-port memory, generates a second sequence of addresses corresponding to addresses of a first one of the dual ports of the dual-port memory module, and generates a third sequence of addresses corresponding to addresses of a second one of the dual ports, wherein the corresponding orders of the second and third sequences of addresses correspond to one of the interleaving function and the deinterleaving function between the first data stream and the second data stream.

7. The circuit of claim 6 wherein the dual-port memory module receives the first data stream via the first one of the dual ports, sequentially writes the first data units to corresponding memory locations according to the order of the second sequence of addresses, and sequentially reads the first data units from their corresponding memory locations according to the order of the third sequence of addresses.

8. The circuit of claim 6 wherein the dual-port memory module receives a third data stream via the first one of the dual ports, sequentially writes third data units of the third data stream to corresponding memory locations according to the order of the second sequence of addresses, and generates the second data stream by sequentially reading the third data units from their corresponding memory locations according to the order of the third sequence of addresses.

9. The circuit of claim 6 further comprising a synchronization signal communicated between the first address generator module and the second address generator module.

10. The circuit of claim 5 wherein the dual-port memory module has less memory space than the single-port memory module.

11. The circuit of claim 1 wherein the single-port memory module includes independent blocks of the memory locations, wherein each block corresponds to an independent one of interleaving functions and deinterleaving functions between corresponding pairs of a plurality of first data streams and second data streams.

12. The circuit of claim 11 wherein the blocks are of equal size.

13. The circuit of claim 11 further comprising:
    a resource allocation table module that generates an address corresponding to a selected one of the blocks based on a selected one of the corresponding pairs of first data streams and second data streams; and
    a plurality of first address generator modules associated with corresponding ones of the blocks, wherein a selected one of the plurality of first address generator modules addresses the memory locations within the selected block.

14. The circuit of claim 13 wherein the resource allocation module dynamically determines a size of each block based on an interleaving depth associated with each block.

15. A communication circuit comprising the circuit of claim 1, wherein the circuit of claim 1 communicates with one of a modulator and a demodulator.

16. The communication circuit of claim 15 further comprising one of a line driver and a line receiver that communicates with the one of the modulator and demodulator.

17. A very high bit-rate digital subscriber line (VDSL) communication circuit that includes the circuit of claim 1.

18. A method of performing interleaving and deinterleaving functions in a digital communication system, the method comprising:
reading first data units from memory locations of a single-port memory module referenced by a first interleaved sequence of addresses;
generating a first data stream based on the first data units;
writing second data units from a second data stream to the memory locations;
one of transmitting signals based on the first data stream over a communications channel and generating the second data stream based on signals received over the communications channel; and
generating the first interleaved sequence of addresses based on one of an interleaving function and a deinterleaving function between the first data stream and the second data stream.

19. The method of claim 18 wherein each reading step executes immediately prior to each writing step for each of the memory locations.

20. The method of claim 19 wherein each reading step and writing step are associated with the same memory location.

21. The method of claim 18 wherein the interleaving function includes a triangular convolutional interleaving (TCI) function.

22. The method of claim 18 further comprising providing a dual-port memory module that stores the data units associated with one of the reading step and the writing step.

23. The method of claim 22 further comprising:
communicating with the dual-port memory module;
generating a second sequence of addresses corresponding to addresses of a first port of the dual-port memory module; and
generating a third sequence of addresses corresponding to addresses of a second port of the dual-port memory module, wherein the corresponding orders of the second and third sequences of addresses correspond to one of the interleaving function and the deinterleaving function between the first data stream and the second data stream.

24. The method of claim 23 wherein the dual-port memory module receives the first data stream via the first one of the dual ports and further comprising sequentially writing the first data units to corresponding memory locations according to the order of the second sequence of addresses, and sequentially reading the first data units from their corresponding memory locations according to the order of the third sequence of addresses.

25. The method of claim 23 wherein the dual-port memory module receives a third data stream via the first one of the dual ports and further comprising sequentially writing third data units of the third data stream to corresponding memory locations according to the order of the second sequence of addresses, and generating the second data stream by sequentially reading the third data units from their corresponding memory locations according to the order of the third sequence of addresses.

26. The method of claim 23 further comprising synchronizing generating an individual address from each of the first interleaved sequence of addresses, the second sequence of address locations, and the third sequence of address locations.

27. The method of claim 22 wherein the dual-port memory module has less memory space than the single-port memory module.

28. The method of claim 18 further comprising maintaining independent blocks of the memory locations, wherein each block corresponds with an independent one of interleaving functions and deinterleaving functions between corresponding pairs of a plurality of first data streams and second data streams.

29. The method of claim 28 wherein the blocks are of equal size.

30. The method of claim 28 further comprising:
generating an address corresponding to a selected one of the blocks based on a selected one of the corresponding pairs of first data streams and second data streams.

31. The method of claim 30 further comprising dynamically determining a size of each block based on an interleaving depth associated with each block.

32. The method of claim 18 further comprising one of a modulating step and a demodulating step.

33. The method of claim 32 wherein the one of transmitting and generating step is associated with a respective one of the modulating and demodulating steps.

34. A very high bit-rate digital subscriber line (VDSL) communication method that includes the method of claim 18.

* * * * *